(12) United States Patent
Nam et al.

(10) Patent No.: US 7,292,082 B2
(45) Date of Patent: Nov. 6, 2007

(54) DIGITAL DUTY CYCLE CORRECTOR FOR MULTI-PHASE CLOCK APPLICATION

(75) Inventors: Jang Jin Nam, Kyungbuk (KR); Hong June Park, Kyungbuk (KR)

(73) Assignee: Postech (KR)

( * ) Notice: Subject to any disclaimer, the term of this patent is extended or adjusted under 35 U.S.C. 154(b) by 29 days.

(21) Appl. No.: 11/148,642

(22) Filed: Jun. 9, 2005

(65) Prior Publication Data

US 2006/0028256 A1     Feb. 9, 2006

(30) Foreign Application Priority Data

Aug. 6, 2004     (KR) .................. 10-2004-0062077

(51) Int. Cl.
*H03K 3/017* (2006.01)
(52) U.S. Cl. ...................... 327/175; 327/172
(58) Field of Classification Search ............... None
See application file for complete search history.

(56) References Cited

U.S. PATENT DOCUMENTS

| | | | |
|---|---|---|---|
| 6,426,660 B1 * | 7/2002 | Ho et al. ............ | 327/175 |
| 6,535,040 B2 * | 3/2003 | Jung et al. .......... | 327/175 |
| 6,603,337 B2 * | 8/2003 | Cho .................. | 327/149 |
| 6,639,441 B2 * | 10/2003 | Ono et al. ........... | 327/175 |
| 6,958,639 B2 * | 10/2005 | Park et al. .......... | 327/175 |
| 6,967,514 B2 * | 11/2005 | Kizer et al. ......... | 327/175 |
| 7,015,739 B2 * | 3/2006 | Lee et al. ........... | 327/175 |

FOREIGN PATENT DOCUMENTS

JP     02002235 A * 1/1990

* cited by examiner

*Primary Examiner*—Cassandra Cox
(74) *Attorney, Agent, or Firm*—Cantor Colburn LLP

(57) ABSTRACT

Provided is a digital duty cycle corrector for a multi-phase clock application which includes a flip-flop receiving a signal having a first clock cycle as an input and generating a reference signal having a cycle twice the first clock cycle, a duty corrector generating a signal having a second clock cycle that is half the cycle of the reference signal, from the reference signal, a duty detector measuring an amount of a duty error of the second clock cycle signal and generating a digital code value to control a duty cycle of the second clock cycle signal becomes 50%, and a phase inverter inverting a phase of the second clock cycle signal by 180° such that a rising edge of the second clock cycle signal is always fixed constantly regardless of a duty cycle correction operation.

8 Claims, 4 Drawing Sheets

DIGITAL DUTY CYCLE CORRECTOR FOR MULTI-PHASE CLOCK APPLICATION

BACKGROUND OF THE INVENTION

1. Field of the Invention

The present invention relates to a duty clock of a clock, and more particularly, to a duty cycle corrector of an internally generated clock.

2. Description of the Related Art

Since all blocks of a duty cycle corrector can be embodied with digital logic, operation characteristics of the duty cycle corrector with respect to changes in operating temperature, process, and power voltage are superior and a correction to distortion of an input clock duty in a wide range is possible. Since phase information between multi-phase clocks is constantly maintained, an application of the duty cycle corrector to a system needing the multi-phase clock is possible. Also, since the duty information is stored as a digital code value, a quick switch from a ready mode to a normal operation mode is possible.

In an SDRAM (DDR-SDRAM) using both rising edge and falling edge of a clock and circuits such as a MUX/DEMUX for a high speed data transmission, a clock accurately maintaining a 50% duty cycle is a core factor in determining performance of an overall system. Furthermore, in an application such as a pipeline analog-to-digital converter (pipeline-ADC), in addition to correction to accurately maintain the 50% duty cycle, constantly maintaining phase information between multi-phase clocks is also important.

FIGS. 1A and 1B show conventional analog duty cycle correctors used to solve the duty cycle problem. FIG. 1A shows an example of a conventional analog duty cycle corrector. The analog duty cycle corrector includes a duty cycle correction unit 110 and a control voltage generator 120.

The input and output of the duty cycle correction unit 110 and the control voltage generator 120 is a double-input/double-output system having a complementary value. The control voltage generator 120 generates an analog offset voltage proportional to a duty cycle to maintain a clock duty cycle by 50%. The duty cycle correction unit 110 corrects a duty cycle of a clock by receiving the analog offset voltage as a control voltage.

The above method having merits such as a small chip size and a low power consumption has been widely used. However, since the method is characteristically sensitive to a change in temperature, process, and voltage according to the configuration of an analog circuit. Also, the method has a demerit of losing duty cycle correction information in a ready mode in which a power voltage decreases or the operation of an analog circuit portion is discontinued.

Since the inclination of a rising portion and a falling portion of an input clock must be gentle for accurate operation, coercing a duty cycle is with respect to a high speed clock is difficult. Also, during the correction of a clock duty cycle, since both phases of the rising portion and the falling portion of a clock change, phase information of each clock with respect to a multi-phase clock is not maintained.

Thus, according to the above method, the duty cycle of an input clock must be over 40% because a range of an adjustable offset voltage is limited and a range of change of the inclination of the rising portion and the falling portion of the input clock is limited.

FIG. 1B shows another example of the conventional analog duty cycle corrector.

Two voltage controlled delay lines (VCDLs) 130 and 135 and a pulse width detector 150 perform the same function as the duty cycle correction unit 110 of FIG. 1A. The amount of delay of a coarse VCDL 130 is fixed to a value less than 50% of an input clock cycle while the amount of delay of a fine VCDL 135 is adjusted to an output voltage of an op-amp 170. The amount of delay of each VCDL is controlled by a negative feedback loop such that the total amount of delay after passing through the two VCDLs 130 and 135 is 50% of an input clock cycle.

The pulse width detector 150 having a function similar to that of a phase detector of a PLL generates an output clock CLK_OUT having a duty that is corrected using a rising edge of an input clock and a rising edge of a clock passing through the delay lines. Since a rising point of the output clock CLK_OUT is determined by the input clock and a falling point of the output clock CLK_OUT is determined by a delayed clock, the rising edge of the output clock CLK_OUT can maintain information on the input clock during a duty correction process. According to the characteristic in an operation method of the pulse width detector 150, since there must be no section in which two input clock are high at the same time, pulse shapers 140 and 145 generate an output signal having a narrow pulse width.

The duty cycle information of the output clock CLK_OUT can be detected by a frequency-voltage converters (FVCs) 160 and 165 and the op-amp 170. The FVCs 160 and 165 convert high time and low time of a clock to a proportional voltage using a capacitor. By using the two FVCs 160 and 165, the effects of the offset and noise of the op-amp 170 are removed.

The above method is appropriate for an application using the multi-phase clock since only the change point of the falling portion of the clock is controlled. Also, correction to an input duty error of 30%-70% at an input frequency of 19 MHz is possible. However, since the amount of delay is still controlled by using an analog voltage, the method is sensitive to the change in temperature, voltage, and process and the method is difficult to be applied to an application in which a ready mode is needed. Furthermore, since the pulse shapers 140 and 145 are used at an input end of the pulse width detector 150 to decrease the pulse width, the method is difficult to operate at a high frequency.

SUMMARY OF THE INVENTION

To solve the above and/or other problems, the present invention provides a digital duty cycle corrector which is insensitive to changes in process, temperature, and power voltage according to the manufacture of a chip, enable correction of a wide input duty error, and constantly maintains information on a phase of each clock with respect to a multi-phase clock.

According to an aspect of the present invention, a digital duty cycle corrector for a multi-phase clock application comprises a flip-flop receiving a signal having a first clock cycle as an input and generating a reference signal having a cycle twice the first clock cycle, a duty corrector generating a signal having a second clock cycle that is half the cycle of the reference signal, from the reference signal, a duty detector measuring an amount of a duty error of the second clock cycle signal and generating a digital code value to control a duty cycle of the second clock cycle signal becomes 50%, and a phase inverter inverting a phase of the second clock cycle signal by 180° such that a rising edge of the second clock cycle signal is always fixed constantly regardless of a duty cycle correction operation.

The duty cycle is determined by a DLY value that is a 20-bit thermometer code. When the DLY value increases, the duty cycle of the clock CoutP decreases and, when the DLY value decreases, the duty cycle of the clock CoutP increases.

The duty cycle corrector corrects the duty cycle by re-synthesizing a correction clock having a cycle T by using a cycle T/2 delay line and an XNOR gate.

The duty detector comprises a delay line receiving a clock CoutP having a cycle T and delaying the clock CoutP within a range of 40%-60% of the cycle T, a D flip-flop sampled as "high" at a rising edge of an output of the delay line, and a register increasing the digital code value by one bit when an output of the D flip-flop is maintained as "high".

The bidirectional shift register comprises a plurality of registers and each register comprises a flip-flop capable of setting/resetting and a 2:1 multiplexer.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1A:
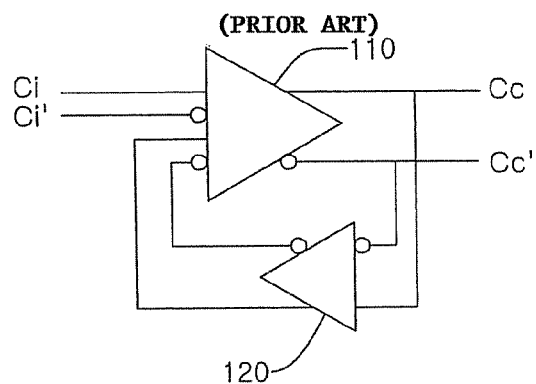
FIG. 1A is a view illustrating an example of a conventional analog duty cycle corrector.
Figure 1B:
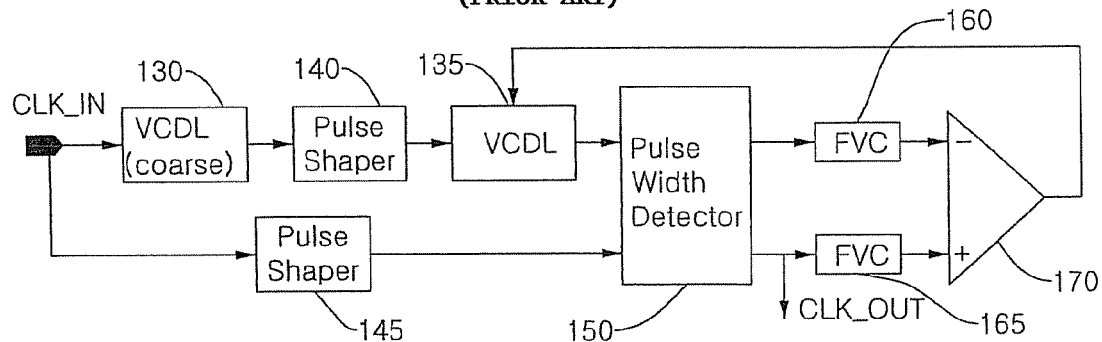
FIG. 1B is a view illustrating another example of the conventional analog duty cycle corrector.
Figure 2:
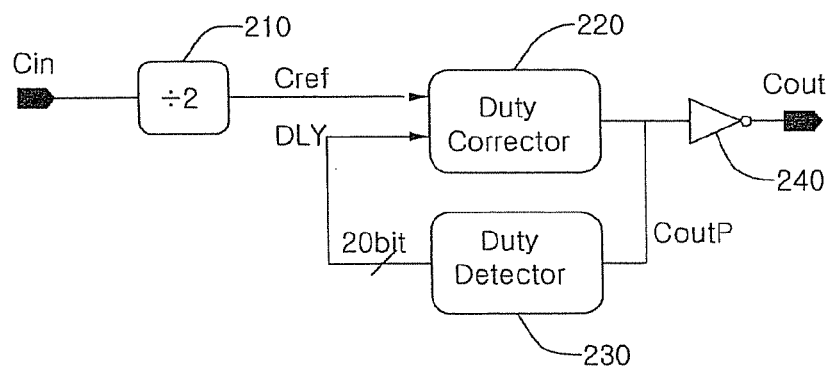
FIG. 2 is a block diagram of a digital duty cycle corrector according to an embodiment of the present invention.

FIG. 2 is a block diagram of a digital duty cycle corrector according to an embodiment of the present invention. Referring to FIG. 2, the digital duty cycle corrector includes a toggle flip-flop 210, a duty corrector 220, a duty detector 230, and a phase inverter 240.

The toggle flip-flop 210 receives an input clock Cin having a cycle T and generates a reference clock Cref having a cycle 2T. Since the reference clock Cref is an output of the toggle flip-flop 210, when setup time and hold time of a flip-flop are secured, correction of duty is possible regardless of a duty cycle of the input clock Cin.

The duty corrector 220 receives the reference clock Cref having a cycle 2T as an input and generates an output clock CoutP having a cycle T. The duty cycle of the output clock CoutP is determined by a DLY value that is a 20-bit thermometer code which is another input to the duty corrector 220. When the DLY value increases, the duty cycle of the output clock CoutP decreases. In contrast, when the DLY value decreases, the duty cycle of the output clock CoutP increases.

The duty detector 230 measures the amount of a duty error of the output clock CoutP of the duty corrector 220 and generates the DLY value that is a digital code value in a direction in which the duty cycle becomes 50%. When the duty cycle of the output clock is less then 50%, the duty detector 230 reduces the DLY value.

Since the above circuit configuration forms a negative feedback loop in view of the duty cycle, it is advantageous that the duty cycle of the output clock CoutP reaches 50% within 10 clock cycles.

The phase inverter 240 inverts a phase of the output clock CoutP by 180° so that a rising edge of the output clock Cout is always and constantly maintained regardless of the duty cycle correction.

Figure 3:
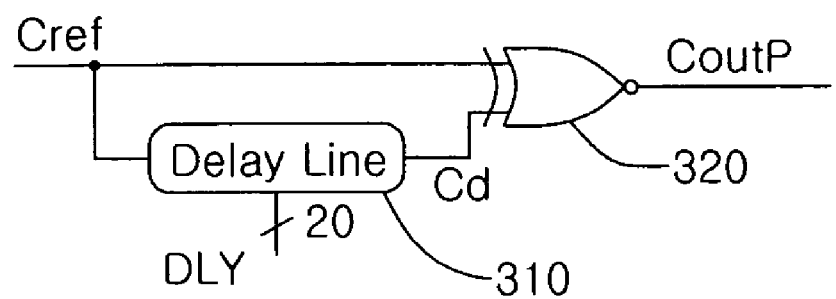
FIG. 3 is a view illustrating a duty corrector in the digital duty cycle corrector of FIG. 2.

FIG. 3 shows in detail the duty corrector 220 in a digital duty cycle corrector of FIG. 2. The duty corrector 220 includes a delay line 310 and an XNOR gate 320. The duty corrector 220 receives the reference clock Cref having a cycle 2T and the DLY value and generates the output clock CoutP. Processing the reference clock Cref and a signal passing through the delay line 310 at the XNOR gate 320 is to synthesize the output clock CoutP having a cycle T and form a negative feedback loop in view of the duty cycle by decreasing the duty cycle of the output clock CoutP as the DLY value which is an output of the duty detector at the rear end. The amount of delay of the delay line 310 linearly increases according to an increase of the DLY value. The changeable amount of delay of the delay line 310 is set to be 40%-60% of the cycle T of the input clock Cin to compensate for changes in process, temperature, and voltage.

Figure 4:
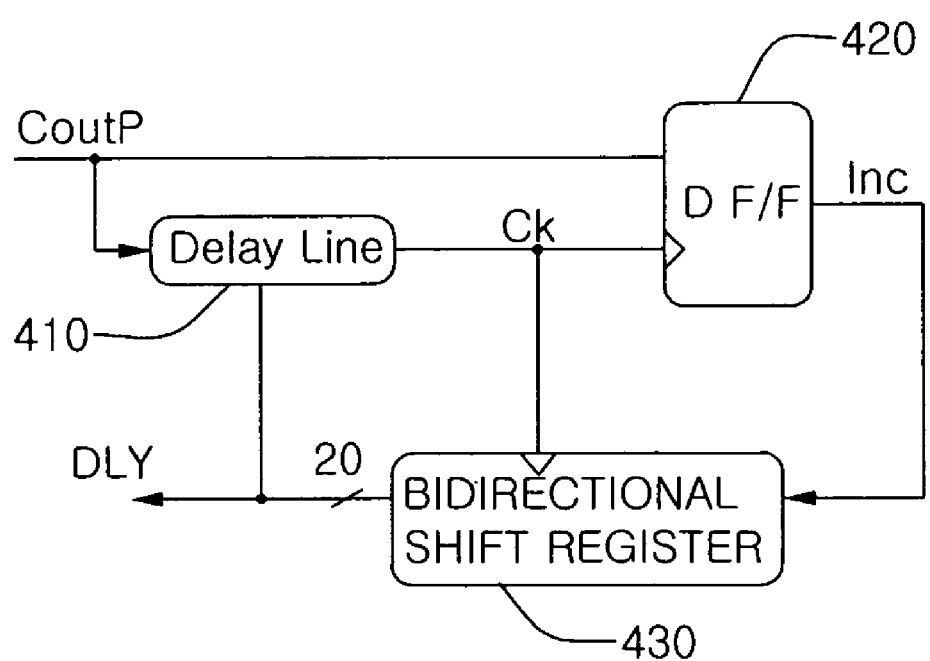
FIG. 4 is a view illustrating a duty detector in the digital duty cycle corrector of FIG. 2.

FIG. 4 is a view illustrating a duty detector in the digital duty cycle corrector of FIG. 2. The duty detector 230 receives the output clock CoutP having a cycle T as an input and generates a 20-bit digital code DLY and includes a delay line 410, a D flip-flop 420, and a bidirectional shift register (BSR) 430.

The delay line 310 used in the duty corrector 220 is used as the delay line 410. This is to make the amounts of delay of two delay lines 310 and 410 the same with respect to the DLY value. When the duty cycle of the output clock CoutP is greater than 50%, this means that the amount of delay of the two delay lines 310 and 410 is less than 0.5T. In this case, since the output clock CoutP which is an input to the D flip-flop 420 is always sampled as "high" at the rising edge of a signal Ck passing through the delay line 410, an output Inc of the D flip-flop 420 is maintained as "high". When the output Inc is "high", the bidirectional shift register 430 increases a digital code value by 1 bit.

Figure 5A:
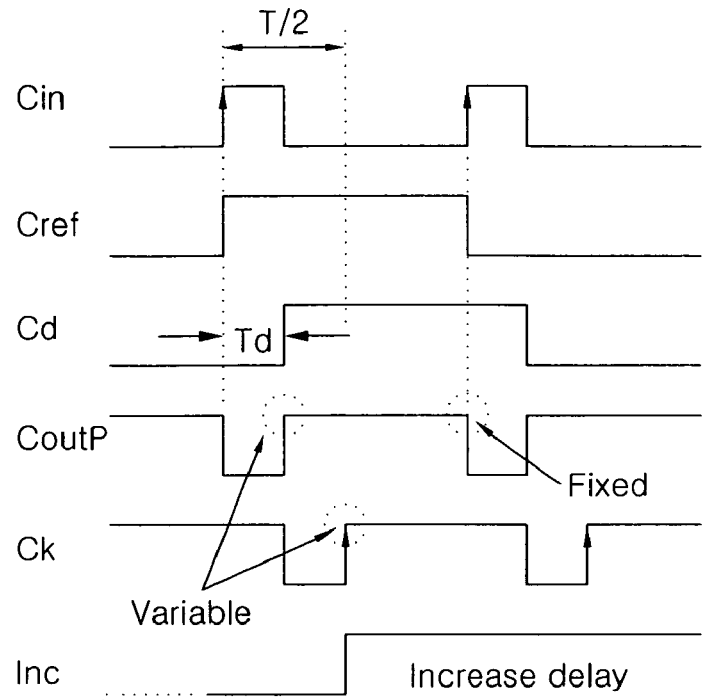
FIGS. 5A and 5B are views illustrating operations of the overall circuit shown in FIG. 2 for cases in which the amount of delay of a delay line is less and greater than a half clock cycle, respectively.
Figure 5B:
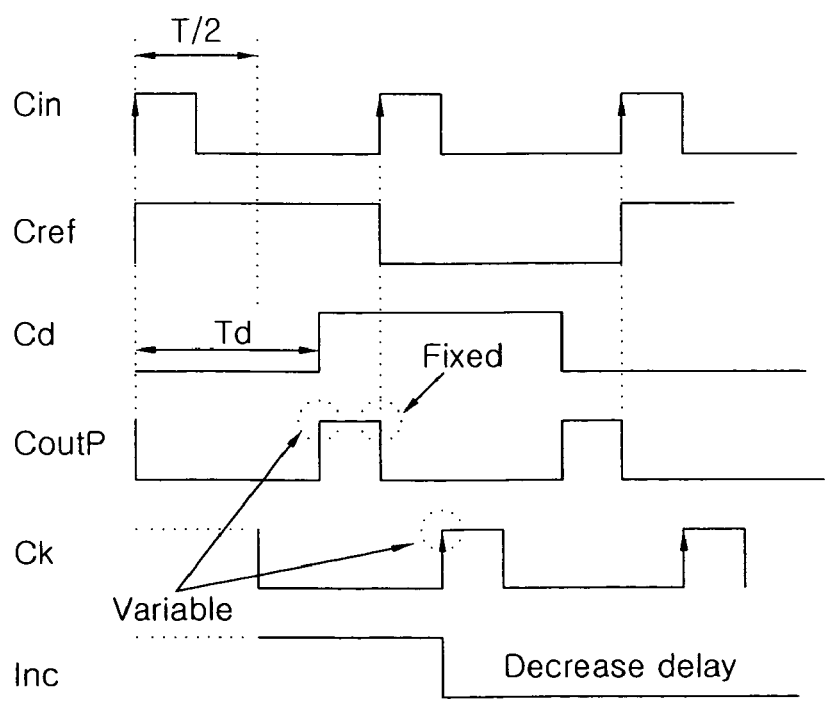

FIGS. 5A and 5B are views illustrating operations of the overall circuit shown in FIG. 2 for cases in which the amount of delay of a delay line is less and greater than a half clock cycle, respectively. When the duty cycle is corrected, the falling edge of the output clock CoutP is fixed and only a point when the rising edge thereof changes is variably adjusted such that the duty is maintained at 50%. Thus, since the phase of the rising edge of the final clock Cout passing through the phase inverter 240 is constantly maintained, an application to a case needing multiphase is possible.

Figure 6:
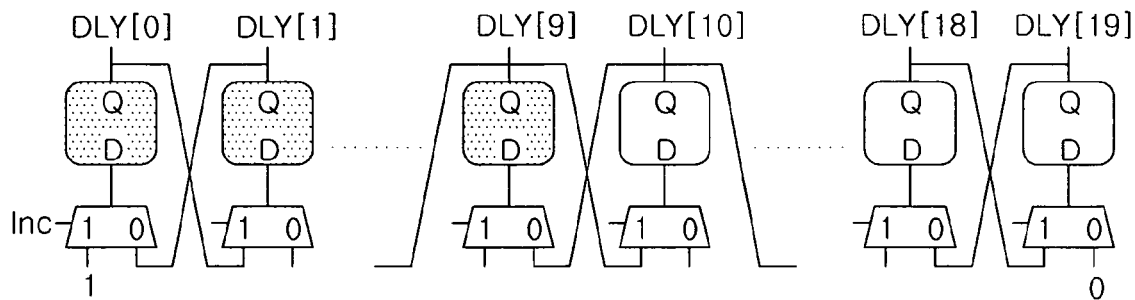
FIG. 6 is a view illustrating a bidirectional shift register which is a constituent element of the duty detector.

FIG. 6 is a view illustrating a bidirectional shift register which is a constituent element of the duty detector. The entire block consists of 20 registers and each register consists of a flip-flop capable of being set/reset and a 2:1 MUX.

Lower 10 bits and upper 10 bits are initially set to have a "high" value and a "low" value, respectively, so that the amount of initial delay of each delay line is set to be about 0.5T. When the output Inc is "high", the output Inc is synchronized to the clock so that the "high" value increases by one bit to the right. When the output Inc is "low", the "low" value increases by one bit to the left.

Figure 7:
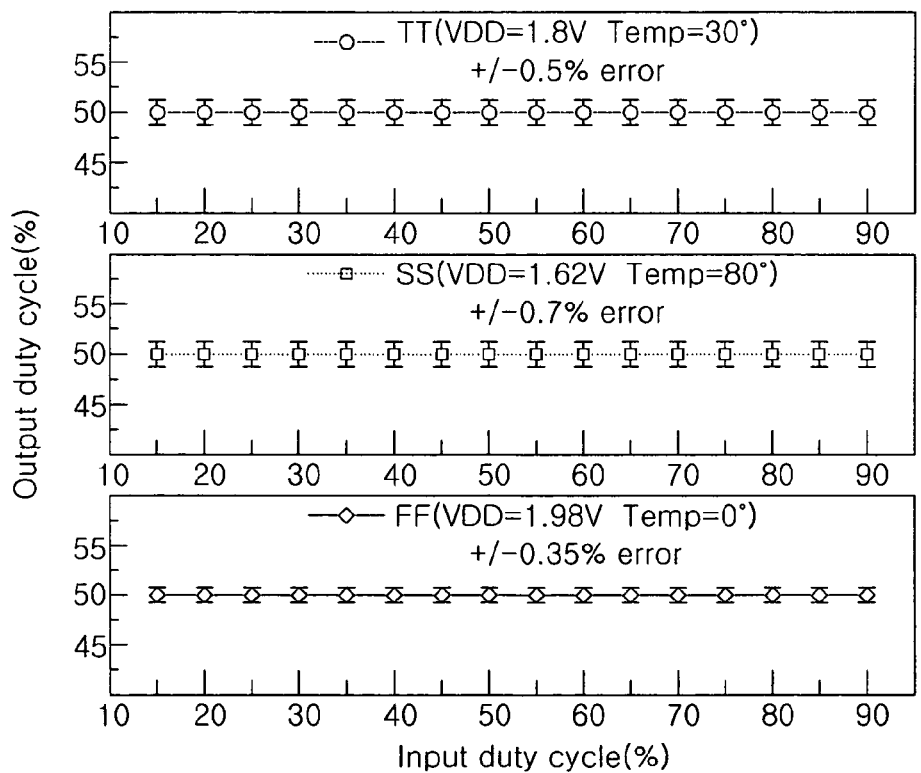
FIG. 7 is graphs showing the process of correcting the duty cycle of an output clock with respect to a 1 GHz input clock through simulations.

FIG. 7 is graphs showing the process of correcting the duty cycle of an output clock with respect to a 1 GHz input clock through simulations. Changes in temperature between 0-80° and power voltage of 10% are reflected in simulation conditions. The simulations were performed with three process conditions of SS (VDD=1.8 V and T=30° C.), TT (VDD=1.62 V and T=80° C.), and FF (VDD=1.98 V and T=0° C.) which are different in the power voltage and the operation temperature. According to the result of the simulations under the above conditions, it can be seen that correction of a duty cycle with respect to an input duty distortion in a wide range of 15%-90% is possible. Also, since the amount of duty is controlled in a digital method, the duty cycle of an output clock is guaranteed regardless of the amount of an input duty error within the maximum range.

While this invention has been particularly shown and described with reference to preferred embodiments thereof, it will be understood by those skilled in the art that various changes in form and details may be made therein without departing from the spirit and scope of the invention as defined by the appended claims.

As described above, according to the present invention, the correction of a duty cycle with respect to input duty distortion in a wide range is possible. Also, since the amount of duty is controlled in a digital method, the duty cycle of an output clock is corrected regardless of the amount of an input duty error within the maximum range.

What is claimed is:

1. A digital duty cycle corrector for a multi-phase clock application comprising:
    a flip-flop receiving a signal having a first clock cycle as an input and generating a reference signal having a cycle twice the first clock cycle;
    a duty corrector generating a signal having a second clock cycle that is half the cycle of the reference signal, from the reference signal;
    a duty detector measuring an amount of a duty error of the second clock cycle signal and generating a digital code value to control a duty cycle of the second clock cycle signal becomes 50%, wherein the digital code value comprises a plurality of binary bits; and
    a phase inverter inverting a phase of the second clock cycle signal by 180° such that a rising edge of the second clock cycle signal is always fixed constantly regardless of a duty cycle correction operation,
    wherein the duty cycle is determined by a thermometer code having a plurality of binary bits so that, when a thermometer code value increases, the duty cycle of the second clock cycle signal decreases and, when a thermometer code value decreases, the duty cycle of the second clock cycle signal increases.

2. The digital duty cycle corrector as claimed in claim 1, wherein the duty cycle is changed by the duty cycle of the second clock cycle signal by being interacted with the digital code value.

3. The digital duty cycle corrector as claimed in claim 1, wherein the duty cycle corrector corrects the duty cycle by re-synthesizing the first clock cycle signal and the second clock cycle signal using a delay line and a logic gate, and wherein the logic gate is an exclusive NOR gate.

4. The digital duty cycle corrector as claimed in claim 1, wherein the duty detector comprises:
    a delay line receiving a clock signal having a cycle T and delaying the clock signal within a range of 40%-60% of the cycle T;
    a D flip-flop sampled as "high" at a rising edge of an output of the delay line; and
    a register increasing the digital code value by one bit when an output of the D flip-flop is maintained as "high".

5. The digital duty cycle corrector as claimed in claim 4, wherein the register is a bidirectional shift register in which an output binary value is capable of being shifted bidirectionally.

6. The digital duty cycle corrector as claimed in claim 4, wherein the register comprises a plurality of unit registers and each unit register comprises a flip-flop capable of setting/resetting and a 2:1 multiplexer.

7. A digital duty cycle corrector for a multi-phase clock application comprising:
    a clock signal generator receiving a signal having a predetermined clock cycle T as an input and generating a clock cycle 2T that is twice the predetermined clock cycle T;
    a duty corrector receiving the 2T clock cycle signal as an input and generating a signal having a cycle T1 that is substantially the same as the predetermined clock cycle T; and
    a duty detector receiving an output of the duty corrector and generating a digital code interacting with a value of the output, wherein the digital code is fed back as another input to the duty corrector and wherein the digital code value comprises a plurality of binary bits,
    wherein the duty detector comprises a delay line, a flip-flop, and a shift register, the digital code value is output from the shift register, and a shifting operation of the shift register is controlled by an output of the flip-flop.

8. The digital duty cycle corrector as claimed in claim 7, wherein the duty corrector is made of a combination of a delay line and a logic gate, the digital code value is input to the delay line to control a delay operation of the delay line, and the 2T clock cycle signal is input to both the delay line and the logic gate.

* * * * *